United States Patent [19]
Dougherty et al.

[11] Patent Number: 5,194,833
[45] Date of Patent: Mar. 16, 1993

[54] AIRBRIDGE COMPENSATED MICROWAVE CONDUCTORS

[75] Inventors: Richard M. Dougherty, Scottsdale; Ronald F. Kielmeyer, Jr., Tempe; Michael Dydyk; Lyle A. Fajen, both of Scottsdale, all of Ariz.

[73] Assignee: Motorola, Inc., Schaumburg, Ill.

[21] Appl. No.: 792,568

[22] Filed: Nov. 15, 1991

[51] Int. Cl.$^5$ ............................................. H01P 5/08
[52] U.S. Cl. .................................... 333/33; 333/246; 333/247
[58] Field of Search ............... 333/33, 35, 238, 246, 333/247, 263

[56] References Cited

U.S. PATENT DOCUMENTS

| | | | |
|---|---|---|---|
| 3,995,239 | 11/1976 | Head et al. | 333/246 X |
| 4,281,302 | 7/1981 | Stegens | 333/246 X |
| 4,549,197 | 10/1985 | Brehm et al. | 357/41 |
| 4,739,519 | 4/1988 | Findley | 333/238 X |
| 4,853,624 | 8/1989 | Rabjohn | 333/246 X |
| 4,906,953 | 3/1990 | Li et al. | 333/33 |
| 4,959,705 | 9/1990 | Lemnios et al. | 357/51 |
| 5,105,171 | 4/1992 | Wen et al. | 333/238 X |

FOREIGN PATENT DOCUMENTS 1-117401  5/1989  Japan ................................. 333/128

OTHER PUBLICATIONS

"The Effect of Air Bridge Height on the Propagation Characteristics of Microstrip" by Marc E. Goldfarb and Vijai K. Tripathi, *IEEE Microwave and Guided Wave Letters*, vol. 1, No. 10, Oct. 1991, pp. 273,274.

*Primary Examiner*—Paul Gensler
*Attorney, Agent, or Firm*—Robert M. Handy

[57] ABSTRACT

The performance of microwave coplanar and other circuit boards is improved by providing local matching elements for adjusting the characteristic impedance of local transmission line segments to better match the input or output impedance of the particular devices to which they couple. This is accomplished by providing a conductive bridge over the active lead of the transmission line, thereby lowering its characteristic impedance. This is very useful for narrow transmission line segments needed to make contact to small active device and/or MMIC's and which otherwise exhibit a substantial impedance mismatch with such small elements.

14 Claims, 5 Drawing Sheets

5,194,833

AIRBRIDGE COMPENSATED MICROWAVE CONDUCTORS

FIELD OF THE INVENTION

The present invention concerns an improved means and method for conductors in microwave circuits.

BACKGROUND OF THE INVENTION

The problems associated with providing efficient signal propagation at microwave frequencies, that is at frequencies generally above about 100 MHz and more particularly above about 1 GHz, are substantially different than the problems encountered at lower frequencies. The use of ordinary wires is generally impractical at microwave frequencies. Although coaxial cables may be used for some connections, they are generally not suitable for interconnections between the comparatively small components or electronic elements that frequently make up microwave circuits. Hence it has become common in the art to use dielectric circuit boards with thin flat conductors layers bonded to one or both sides. The conductor layers are etched or otherwise shaped to provide a variety of substantially planar conductive traces that interconnect the various passive and/or active components or elements mounted on the board. These conductive traces also permit input and output connections to the circuit board.

For efficient propagation of microwave signals it is important that the conductors on the circuit board form a transmission line having a known and well controlled characteristic impedance. Two well known conductor arrangements in widespread use for microwave circuits are illustrated in FIGS. 1A-B and 2A-B. FIGS. 1A-B illustrate in plan and cross-sectional view respectively, microstrip line 10 comprising dielectric substrate 12, front surface conductor 14 and rear surface ground plane 16. The characteristic impedance of this microwave conductor arrangement is determined primarily by thickness 13 and the dielectric constant of substrate 12 and by width 15 of surface conductor 14.

A coplanar waveguide arrangement suitable for use on microwave circuit boards is shown in FIGS. 2A-B. Coplanar transmission line 20 comprises dielectric substrate 22 of thickness 23 having conductors 24, 24', 28 on a principal surface thereof. Conductors 24, 24' are ground or reference conductors and conductor 28 is the active (un-grounded) conductor. Reference conductors 24, 24' and active conductor 28 are separated by gaps 25, 25' of widths 26, 26'. Active conductor 28 has width 29. The characteristic impedance of coplanar waveguide 20 depends primarily on the width of active conductor 28 and the widths 26, 26' of gaps 25, 25'. Gaps widths 26, 26' on each side of conductor 28 need not be equal, but that is convenient.

FIG. 3 shows in plan view, illustrative coplanar microwave circuit board 30 containing microwave component 31, as for example, a microwave transistor or monolithic microwave integrated circuit (MMIC). Circuit board 30 comprises dielectric substrate 32 on which are coplanar ground or reference conductors 34, 34', 34'', and active conductors 38, 38' and 38'' separated from the reference conductors by gap 35, 35', 35''. Input-output connections are provided by, for example, wire-bonds or other leads 36, 36', 36'' and active device 31 is coupled to conductors 38, 38', 38'' by, for example, further wirebonds or leads 37, 37', 37''. Those of skill in the art will understand, that FIG. 3 is intended merely to illustrate an exemplary arrangement for a microwave circuit board having at least one component and not to be limiting. Many other arrangements are possible and frequently microwave circuit substrates or boards will have large numbers of components thereon. For convenience of explanation, further reference to 34, 35, 36, 37, 38, 40 and 42 unless specifically noted, are intended to include reference to the corresponding primed numbers as well. Dashed line 4A in FIG. 3 indicates that portion of circuit board 30 which is shown somewhat enlarged in FIGS. 4A-B.

Because I/O connections 36 must generally be robust and easily applied, external lead bonding region 40 of leads 38 must have dimensions larger than is otherwise needed elsewhere in circuit 30. The lateral dimensions, e.g., the width of bonding regions 40 and gaps 35 associated therewith are generally chosen so as to provide a characteristic impedance of the coplanar waveguide at the bonding location that is well matched to the external connection. Fifty ohms is a typical target value for the characteristic impedance of the coplanar waveguide formed by bonding regions 40.

Since component 31 is frequently very small, associated bonding portions 42 of conductors 38 where leads 37 attach are generally substantially smaller, i.e., narrower, than external bonding regions 40. For reasons having to do with manufacturing tolerances, gap 35 are generally not scaled with the reduction in lead widths. Hence, as leads 38 become narrower at or near bonding regions 42, their characteristic impedance rises. This produces a significant impedance mismatch problem which makes it difficult to efficiently couple energy into and out of component 31. It is not always possible to modify the line dimensions and/or substrate dielectric constant in such a way to eliminate the impedance mismatch.

There have been attempts in the prior art to deal with impedance mismatch in circuit board transition regions. For example, U.S. Pat. No. 4,906,953 to Li et al., describes an impedance matching arrangement using sloped surfaces to provide an interconnection between microstrip and coplanar waveguide without use of via holes. However, production of such sloped surfaces is comparatively expensive and does not suit all situations.

Other arrangements, well known in the art have also been tried with varying degrees of success. However, many of these involve undesirable trade-offs with respect to manufacturability, yield, cost and/or reliability. Hence, despite many years devoted to microwave circuit development, impedance mismatch problems still remain, especially in connection with efficient coupling to MMIC's and the like.

SUMMARY OF THE INVENTION

The present invention provides an improved means and method for microwave conductors on circuit boards and the like. The means includes most generally, a first coplanar microwave conductor region having a first characteristic impedance, a second coplanar microwave conductor region having a second characteristic impedance different than the first impedance, and another bridging conductor extending over at least part of the second microwave conductor region and separated therefrom, thereby providing a third characteristic impedance for the bridged portion which is less than the second characteristic impedance. In further detail, the second characteristic impedance is usually greater than the first characteristic impedance and the third characteristic impedance and the first characteristic impedance are desirably substantially equal.

There is further provided a method comprising in general form, providing an insulating substrate with a first conductor layer thereon which has at least first and second conductors of predetermined arrangement. The first conductor has a first part of a first width and a second part of a second width greater than the first width. The second conductor has first and second portions extending on either side of but spaced from the first conductor. A first mask is provided on the first conductor layer. The first mask has at least two openings therein, a first opening extending to the first portion and a second opening extending to the second portion. A second conductor layer is provided on the first mask so as to make contact to the first conductor layer through the first and second openings and shaped to have a bridging portion extending between the two openings and over at least some of the first part of the first conductor and electrically connecting the first and second portions of the second conductor.

In more detail according to a preferred embodiment, it is desirable that a second mask be provided on the second conductor layer having a protective region above the intended location of the bridging portion in order to protect the bridging portion of the second conductor layer while other portions of the second conductor layer are removed.

As used herein, the word "airbridge" is intended to refer to a conductor which bridges over another conductor and is separated therefrom by a dielectric or high resistivity material of any type, including but not limited to air or other gaseous dielectrics and solid dielectrics of any sort.

DETAILED DESCRIPTION OF THE DRAWINGS

Figure 1A:
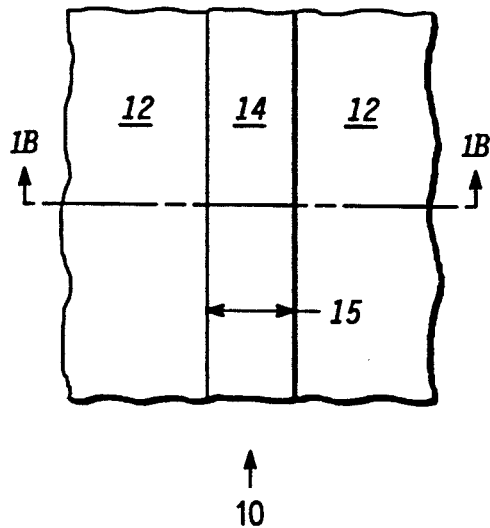
FIGS. 1A and 2A show plan views and FIGS. 1B and 2B show cross-sectional views through FIGS. 1A and 2A respectively, in simplified form, and according to prior art microwave conductor arrangements.
Figure 1B:
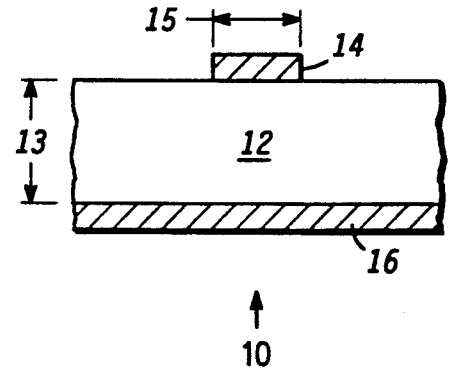
Figure 2A:
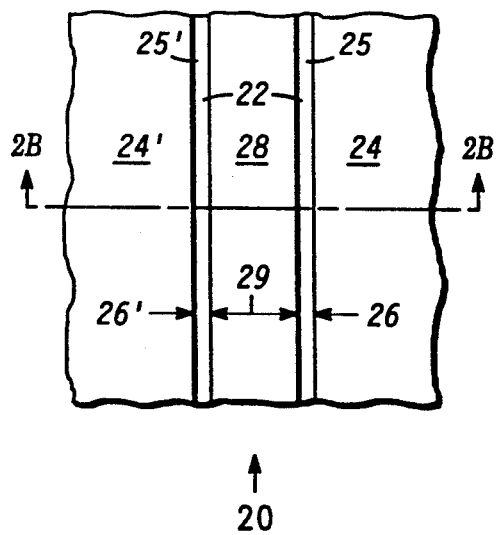
Figure 2B:
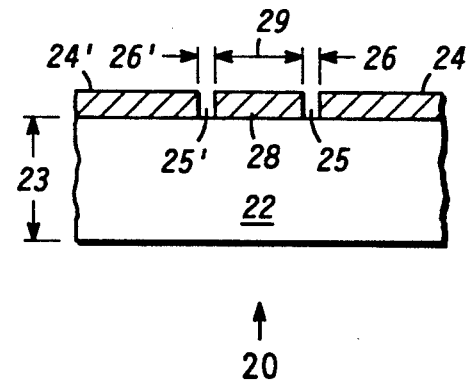
Figure 3:
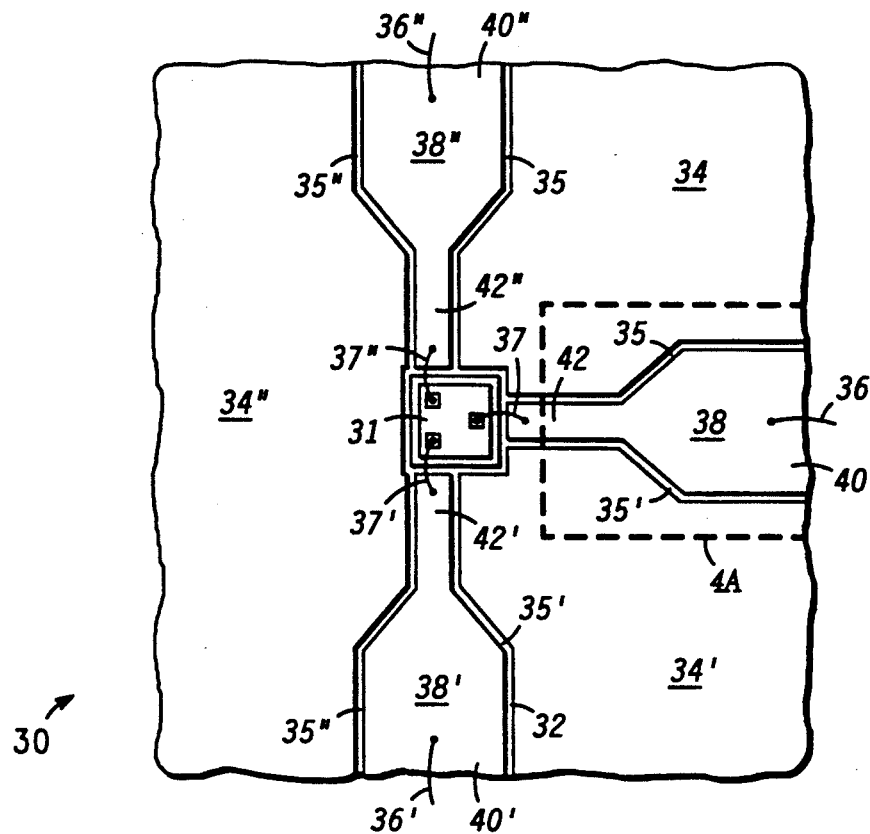
FIG. 3 shows in simplified form, a plan view of a coplanar waveguide circuit board having thereon an active element.
Figure 4A:
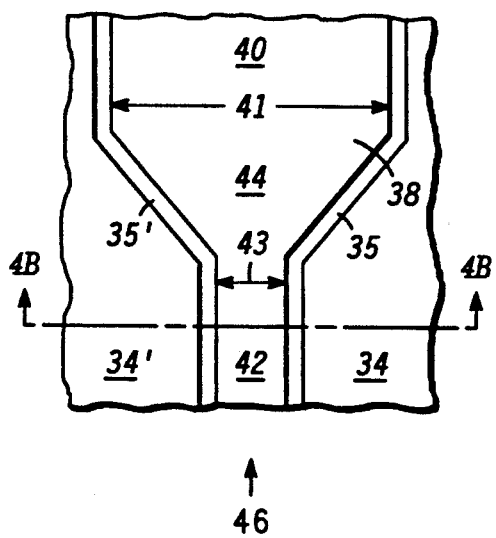
FIG. 4A shows a plan view and FIG. 4B shows a cross-sectional view through FIG. 4A, in simplified form, of a portion of the microwave circuit of FIG. 3.
Figure 4B:
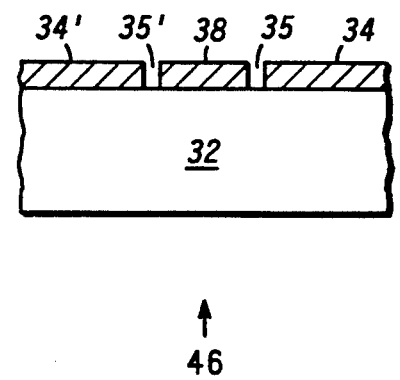

FIG. 4A shows a plan view and FIG. 4B shows a cross-sectional view through FIG. 4A, in simplified form, of a portion of the microwave circuit of FIG. 3. FIGS. 4A-B show portion 46 of microwave circuit 30 having conductors 34 and 38. Conductor 38 has portion 40 of width 41 and portion 42 of width 43, coupled by variable width transition zone 44. Wider portion 40 has a lower characteristic impedance as a consequence of its greater width than narrower portion 42 or transition zone 44. Similarly, narrower portion 42 has a higher impedance than wider portion 40 and transition zone 44. It is this situation which may make it difficult to efficiently couple energy from leads 36 to component 31, especially where component 31 is a low impedance device, that is, having much less input (or output) impedance than the characteristic impedance of adjacent portions 42 of conductors 38.

Figure 5A:
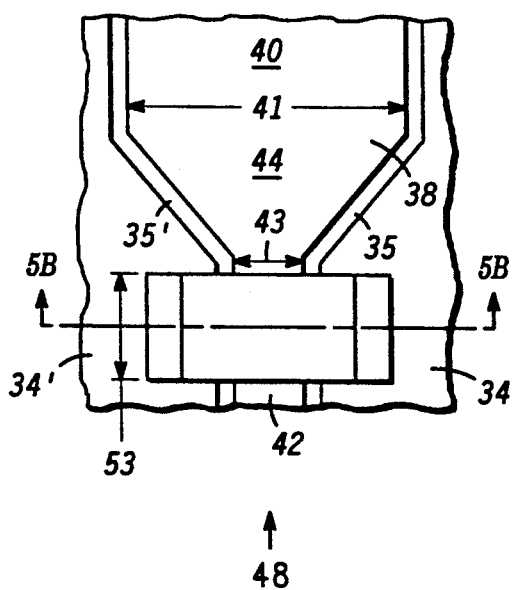
FIG. 5A shows a plan view and FIG. 5B shows a cross-sectional view through FIG. 5A, similar to FIGS. 4A-B respectively, but according to the present invention.
Figure 5B:
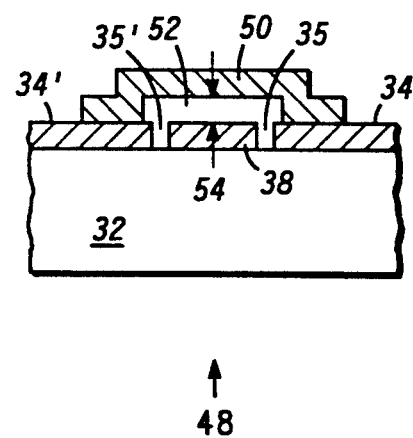

It has been found that the characteristic impedance of the transmission line segments (e.g., conductor portions 42) coupling to device 31 or any equivalent device or element or circuit portion, can be changed to better match the properties of the device or element to the associated transmission line by providing conductive bridge 50, such as is shown in FIGS. 5A-B, electrically coupling ground planes 34 on either side of conductor 38. Conductive bridge 50 passes over the portion of conductor 38 whose impedance is desired to be modified, as for example, narrower portion 42, and is separated therefrom by region 52 of height 54. Region 52 may be an air-gap or may be filled with a dielectric or other comparatively poorly conductive material. Bridge 50 is preferably electrically connected directly to ground planes or reference conductors 34 but may also be capacitively or otherwise coupled thereto.

Bridge 50 increases the capacitance to ground (or other reference potential) of that portion of conductor 38 underlying bridge 50, thereby lowering its characteristic impedance. Thus, the presence of bridge 50 above narrower region 42 compensates for the reduction in conductor width so that a desirable characteristic impedance can still be maintained. This greatly facilitates efficient power transfer into and out of device or circuit element 31.

Figure 6:
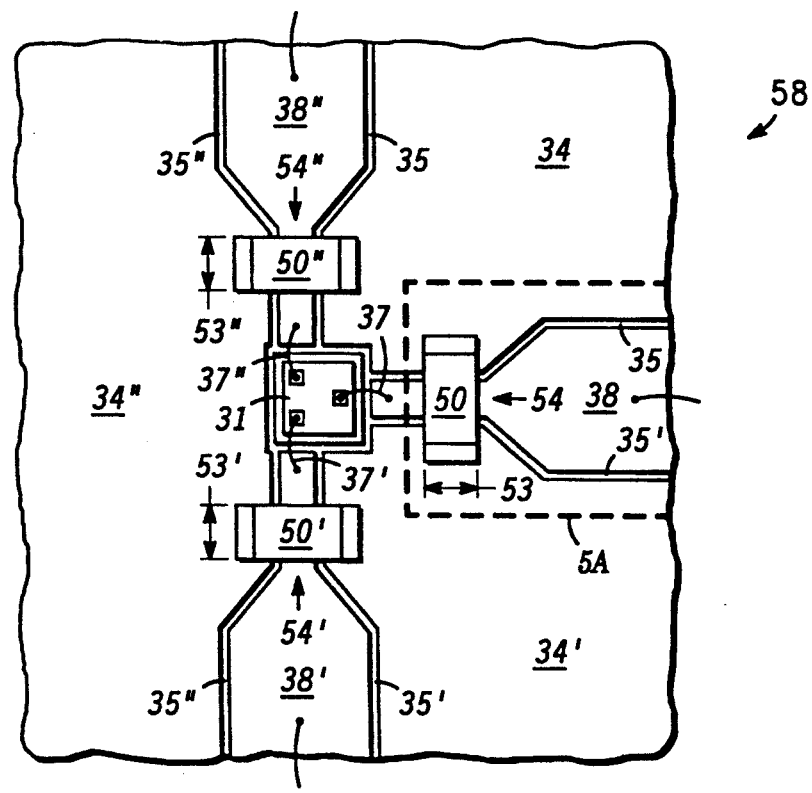
FIG. 6 shows in simplified form, a plan view of a coplanar waveguide circuit similar to FIG. 3 but incorporating the present invention.

FIG. 6 is a plan view of microwave circuit board 58 similar to board 30 to FIG. 3 but with bridges 50, 50', 50" of heights 54, 54', 54" included. While bridges 50, 50', 50" are shown as being provided in all of leads 38, those of skill in the art will appreciate that they may be provided on any number of leads. Further, the change in impedance introduced by bridges 50, 50', 50" may be adjusted varying heights 54, 54', 54" and/or, to some extent, by varying length 53, 53', 53". Dashed line 5A in FIG. 6 indicates that portion of circuit board 58 which is shown somewhat enlarged in FIGS. 5A-B.

The smaller the heights 54, the greater the capacitance per unit length and the lower the characteristic impedance. The greater the lengths 53, the greater the capacitance, but when length 53 is small compared to a wavelength, the airbridge behaves more as a discrete capacitive element rather than a transmission line segment and the greater the length compared to a wavelength, the more it behaves as a transmission line segment. Satisfactory results were obtained with airbridge lengths about equal to a wavelength. By varying heights 54, 54', 54" (and to some extent lengths 53. 53', 53") of individual airbridges 50, 50', 50", the impedance or impedance matching may be individually adjusted for different leads of the component or element of interest or for different parts of the circuit.

FIGS. 7A-H show simplified cross-sectional views and FIGS. 8A-D show simplified plan views of portion 60 of a coplanar microwave circuit board incorporating the present invention during different stages of manufacture. Circuit board 60 comprises substrate 62 on which is provided conductor layer 63 and mask layer 66. Conductor layer 63 is conveniently a metal although other conductive materials may also be used. Substrate 62 analogous to substrate 32, is conveniently a dielectric or a material with a substantially insulating surface. Ceramics, glass impregnated plastics, high resistivity III-V compounds, and oxide coated conductors or semiconductors (e.g., Si or Ge) are non-limiting examples of useful substrate materials. As used herein, the word "dielectric" in reference to substrates is intended to include these and other suitable materials or combinations.

Figure 7A:
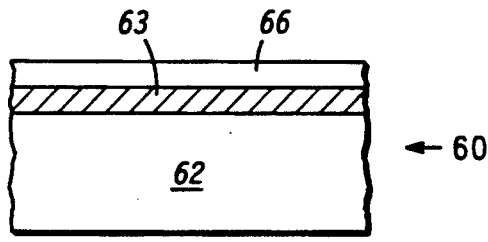
FIGS. 7A-H show in simplified form a sequence cross-sectional views of a microwave circuit according to the present invention at different stages of manufacture.
Figure 7B:
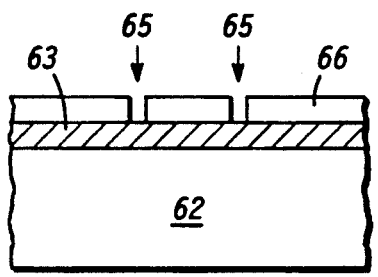
Figure 7C:
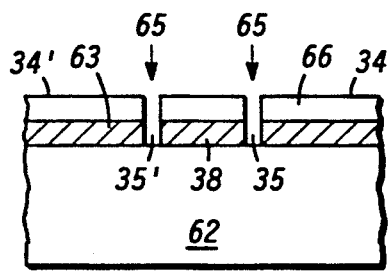
Figure 7D:
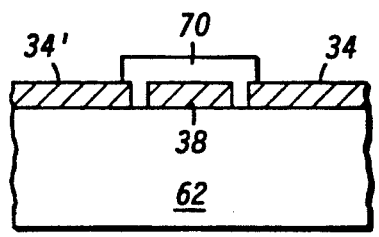
Figure 8A:
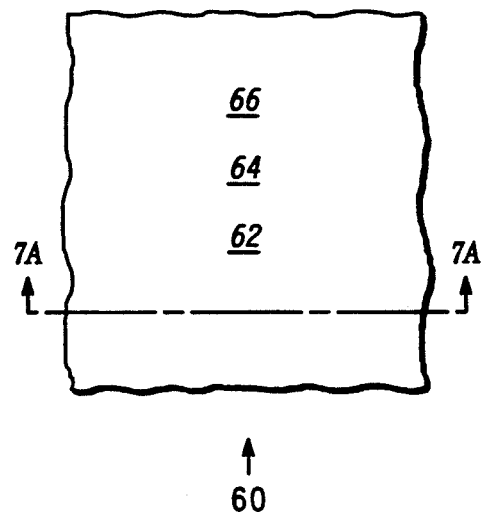
FIGS. 8A-D show plan views corresponding to some of the cross-sectional views of FIGS. 7A-H.
Figure 8B:
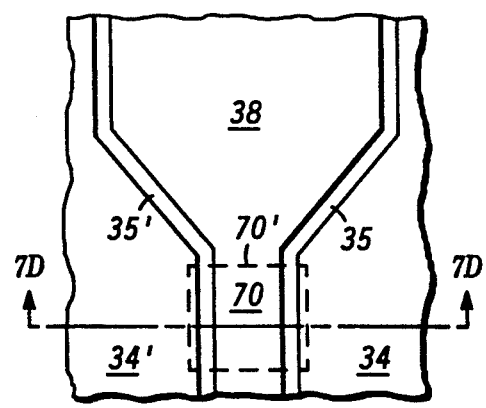

Mask 66 is then treated using means well known in the art to provide open regions 65 in mask 66 extending to underlying conductor layer 63 (see FIG. 7B). Openings 65 in mask 66 correspond to gaps 35 separating the conductors on the finished circuit board (see FIG. 6). Underlying metal layer 63 is then etched or otherwise eroded using conventional techniques to provide gaps 35, 35' separating metal regions 34. 34', 38 of layer 63.

Mask region 70 is then formed over the portion of conductor 38 where the bridge is desired. This is conveniently accomplished, for example, by providing a mask layer everywhere and then exposing and developing an image corresponding to outline 70' (see FIG. 8B) to leave in place mask 70. On FIG. 8B, mask 70 is shown as being transparent and bounded by a dashed line so that the underlying metal structure may be seen. This is conventional in the art.

Figure 7E:
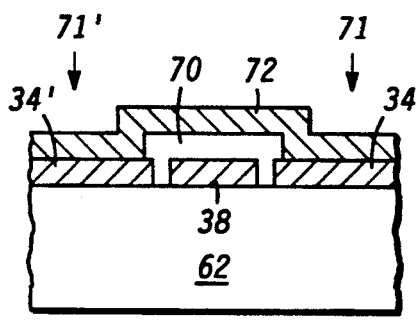
Figure 7F:
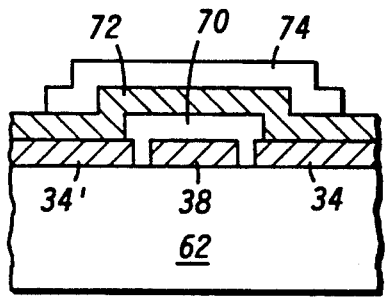

Referring to FIG. 7E, mask 70 should have at least two openings 71, 71' over portions 34, 34' of layer 63 so that second conductor layer 72 can make contact to underlying first conductor 34, 34' on either side of central conductor 38, and a closed portion where bridge 50 is desired to be located. Mask 70 prevents second conductor layer 72 from shorting to underlying conductor 38.

Figure 7G:
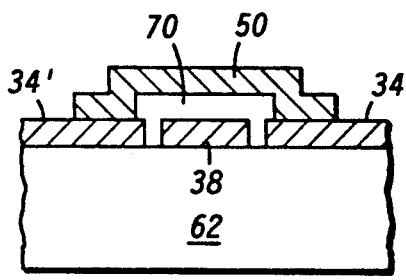
Figure 7H:
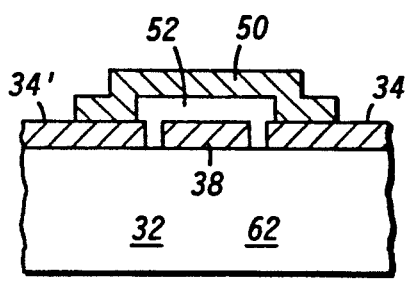
Figure 8C:
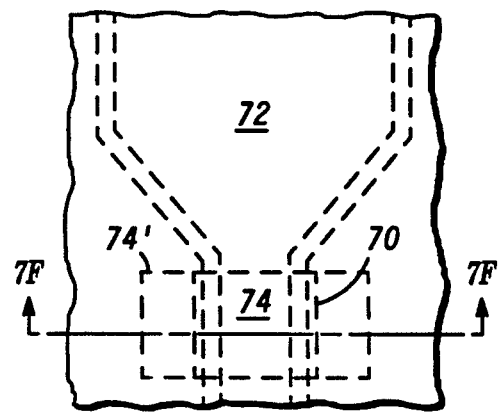
Figure 8D:
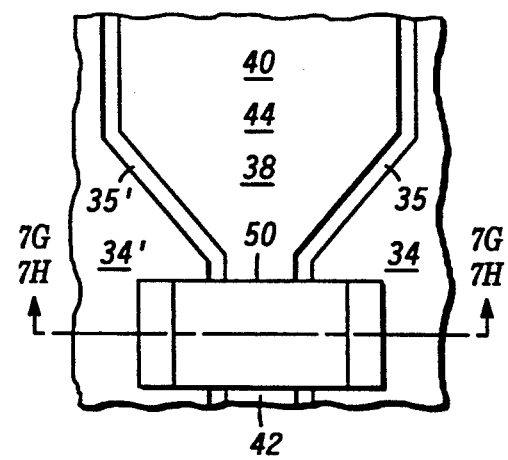

Second conductor layer 72 is then applied over first conductor regions 34, 34' and mask 70 (see FIG. 7E). Second conductor layer 72 is conveniently a metal although other conductive materials may also be used. Second conductor layer 72 is covered by a mask 74 which has been patterned to define the lateral shape of bridge 50, i.e., the width and length parallel to the plane of substrate 62. Outline 74' of mask 74 is shown as a dashed line in FIG. 8C and mask 74 is shown as being transparent so that the underlying details may be seen. The unused portions of conductor layer 72 are removed using mask 74, leaving behind bridge 50 electrically coupling regions 34, 34' of first conductor layer 63 (See FIGS. 7G-H and 8D). Portion 70 of the first mask layer may be left in place, as shown for example ion FIG. 7G or removed to provide an air gap in space 52 of FIG. 7H. FIGS. 7G-H and 8D are analogous to FIGS. 5A-B.

Based on the foregoing description, it will be apparent to those of skill in the art that the present invention solves the problems and achieves the purposes set forth earlier, and has substantial advantages as pointed out herein, namely, (i) is provides a means and method for compensating the characteristic impedance of transmission lines used in connection with microwave circuits, (ii) it permits the impedance of narrow line segments to be lowered to more closely match the impedance of various circuit elements or connections or the like, and (iii) the fabrication techniques steps needed are individually well known and already used in the fabrication of microwave circuits, the impedance matching provided at different locations in the circuit may be individually tailored to the local need by varying the length of the bridge and its spacing above the active conductor and well as varying the dielectric constant of any material left in place to separate the bridge from the underlying active conductor.

While the present invention has been described in terms of particular materials, structures and steps, these choices are for convenience of explanation and not intended to be limiting and, as those of skill in the art will understand based on the description herein, the present invention applies to other choices of materials, arrangements and process steps. For example, while the present invention has been described for use in connection with microwave circuit boards on which various components are mounted, it also applies within microwave integrated circuits themselves (MMIC's) wherein it is useful for adjusting the impedance to active or passive elements built directly in or on, for example, a III-V of Si substrate. Further, the leads or conductors used on the substrates or circuit boards and for the airbridge may include metals, semi-metals, superconductors, semiconductors and other materials exhibiting substantial conductivity. Accordingly, it is intended to include in the claims that follow, these and other variations as will occur to those of skill in the art based on the present disclosure.

We claim:

1. A microwave apparatus for more efficiently coupling signals to a semiconductor device, comprising:
   a substrate having an insulating surface;
   first, second and third conductors disposed on the surface to form a first microwave transmission line, wherein the first conductor lies between and is laterally spaced apart from the second and third conductors, and wherein the first conductor has a first region of a first width and a first characteristic impedance extending from a first end of the first conductor toward a second region of the first conductor of a second width greater than the first width and a second characteristic impedance;
   a semiconductor device proximate to the first end of the first conductor and having a terminal presenting a predetermined input impedance electrically connected thereto; and
   a fourth conductor forming an airbridge extending between the second and third conductors over the first region of the first conductor, wherein the fourth conductor has a length in a direction of propagation of signals along the first conductor sufficient to reduce the first characteristic impedance to more closely match the predetermined input impedance of the semiconductor device, thereby reducing insertion loss when coupling signals thereto.

2. The arrangement of claim 1 wherein the second characteristic impedance is less than the first characteristic impedance.

3. The arrangement of claim 1 wherein the first conductor lies between and is laterally spaced apart from the second and third conductors by a pre-determined distance.

4. The arrangement of claim 1 wherein the first conductor has a first region of a first width and a second region of a second width joined by a third transition region.

5. The arrangement of claim 4 wherein the airbridge extends between the second and third conductors over the first region of the first conductor adjacent the third transition region.

6. The arrangement of claim 1 wherein the airbridge has a length in a direction of microwave conduction that is less than a wavelength of a signal propagating along the first conductor.

7. A microwave apparatus comprising:
a substrate having an insulating surface;
first, second and third conductors disposed on the surface to form a first microwave transmission line, wherein the first conductor lies between and is laterally spaced apart from the second and third conductors, and wherein the first conductor has a first region of a first width extending from a first end of the first conductor toward a second region of the first conductor of a second width greater than the first width;
a semiconductor device proximate to the first end of the first conductor and having a terminal electrically connected thereto;
a fourth conductor forming an airbridge extending between the second and third conductors over at least part of the first region of the first conductor;
fifth and sixth conductors disposed on the surface to form a second microwave transmission line, wherein the fifth conductor lies between and is laterally spaced apart from the second and sixth conductors and wherein the fifth conductor has a first region of a first width extending from a first end of the fifth conductor toward a second region of the fifth conductor of a second width greater than the first width, and wherein the first end of the fifth conductor is proximate to the semiconductor device and electrically coupled to a terminal thereof; and
a seventh conductor forming an airbridge extending between the second and sixth conductors over at least part of the first region of the fifth conductor.

8. The arrangement of claim 7 further comprising an eighth conductor disposed on the surface to form a third microwave transmission line, wherein the eighth conductor lies between and is laterally spaced apart from the third and sixth conductors and wherein the eighth conductor has a first region of a first width extending from a first end of the eighth conductor toward a second region of the eighth conductor of a second width greater than the first width, and wherein the first end of the eighth conductor is proximate to the semiconductor device and electrically coupled to a terminal thereof, and a ninth conductor forming an airbridge extending between the third and sixth conductors over at least part of the first region of the eighth conductor.

9. A microwave apparatus comprising:
a substrate having an insulating surface;
first, second and third conductors disposed on the surface to form a first microwave transmission line, wherein the first conductor lies between and is laterally spaced apart from the second and third conductors, and wherein the first conductor has a first region of a first width extending from a first end of the first conductor toward a second region of the first conductor of a second width greater than the first width;
a semiconductor device proximate to the first end of the first conductor and having a terminal electrically connected thereto;
a fourth conductor forming an airbridge extending between the second and third conductors over at least part of the first region of the first conductor, wherein the airbridge has a length in a direction of microwave conduction that is at least about a wavelength of a signal propagating along the first conductor.

10. A microwave apparatus comprising:
a first coplanar microwave conductor region having a first characteristic impedance;
a second coplanar microwave conductor region coupled to the first coplanar microwave conductor region and having a direction along which signals propagate and having a second characteristic impedance different than the first characteristic impedance;
a semiconductor electronic element proximate to an end of the second coplanar microwave conductor region and electrically coupled thereto, wherein the semiconductor electronic element present a third characteristic impedance to the second coplanar microwave conductor region; and
an airbridge conductor extending over at least part of the second microwave conductor region and having a length along the direction of signal propagation of the second microwave conductor region sufficient to provide a fourth characteristic impedance for the combination of the airbridge conductor and the second microwave conductor region wherein the magnitude of the fourth characteristic impedance is closer to the third characteristic impedance than the second characteristic impedance.

11. The arrangement of claim 10 wherein the second characteristic impedance is greater than the first characteristic impedance.

12. The arrangement of claim 11 wherein the fourth characteristic impedance and the first characteristic impedance are substantially equal.

13. The arrangement of claim 10 wherein the airbridge has a length along the second conductor region that is less than a wavelength of a signal propagating along the second conductor region.

14. A microwave apparatus comprising:
a first coplanar microwave conductor region having a first characteristic impedance;
a second coplanar microwave conductor region coupled to the first coplanar microwave conductor region and having a second characteristic impedance different than the first characteristic impedance;
an electronic element proximate to an end of the second coplanar microwave conductor region and electrically coupled thereto, wherein the electronic element presents a third characteristic impedance to the second coplanar microwave conductor region; and
an airbridge conductor extending over at least part of the second microwave conductor region thereby providing a fourth characteristic impedance for the combination of the airbridge conductor and the second conductor region wherein the magnitude of the fourth characteristic impedance is closer to the third characteristic impedance than the second characteristic impedance, wherein the airbridge has a length along the second conductor region that is at least about equal to a wavelength of a signal propagating along the second conductor region.

* * * * *